United States Patent [19]

Abe et al.

[11] Patent Number: 4,582,728

[45] Date of Patent: Apr. 15, 1986

[54] PROCESS FOR PREPARING A TITANIUM CARBIDE FILM

[75] Inventors: Tetsuya Abe, Ibaragi; Kounosuke Inagawa, Chiba; Kenjiro Obara, Ibaragi; Yoshio Murakami, Mito, all of Japan

[73] Assignee: Japan Atomic Energy Research Institute, Tokyo, Japan

[21] Appl. No.: 523,440

[22] Filed: Aug. 16, 1983

[30] Foreign Application Priority Data

Aug. 17, 1982 [JP] Japan .................. 57-141624

[51] Int. Cl.$^4$ .................. C23C 11/00; C23C 13/00
[52] U.S. Cl. .................. 427/249; 427/255.2
[58] Field of Search .................. 427/249, 255.2

[56] References Cited

U.S. PATENT DOCUMENTS 3,369,924  2/1968  Bourdeau et al. .................. 427/249
3,642,522  2/1972  Gass et al. .................. 427/249

OTHER PUBLICATIONS

Sedgwick et al, Proceedings of the Seventh International Conference on Chemical Vapor Deposition, pp. 480–481, 1979.

Bunshah et al, "Activated Reactive Evaporation Process for High Rate Deposition of Compounds", J. Vac. Sci. Tech., vol. 9, No. 6, 1972, pp. 1385–1388.

Raghuram et al, "The Effect of Substrate Temperature on the Structure of Titanium Carbide Deposited by Activated Reactive Evaporation", J. Vac. Sci. Tech., vol. 9, No. 6, pp. 1389–1394, 1972.

Primary Examiner—Sadie L. Childs
Attorney, Agent, or Firm—Oblon, Fisher, Spivak, McClelland & Maier

[57] ABSTRACT

A process for preparing a titanium carbide film characterized by vaporizing metallic titanium from a metallic titanium vaporizing source placed in an atmosphere containing a dilute acetylene gas and depositing titanium carbide onto the surface of base set up facing said source.

1 Claim, 2 Drawing Figures

PROCESS FOR PREPARING A TITANIUM CARBIDE FILM

BACKGROUND OF THE INVENTION

In general, a first wall (a wall directly facing on plasma) of nuclear fusion apparatus interacts with heat radiation from plasma and plasma constituent particle leaked out from plasma confinement region, and as the result the first wall is eroded to release first wall constituent materials as an impurity in the plasma. Therefore, the first wall is regarded as a main source of plasma impurity. On the other hand, in order to elevate a plasma temperature as higher as possible in a nuclear fusion reaction, it is necessary to lower an energy loss by impurity from plasma to the utmost. It is known that the energy loss by impurity increases with atomic number of impurity element under the same content. Accordingly, it is now planned to use a material of small atomic number such as carbide, boride, etc. as a first wall constituent material of nuclear fusion apparatus, and among them, titanium carbide having a stoichiometric composition, i.e. Ti/C=1 is the most hopeful material proposed. However, from a view of mechanical processability and mechanical strength., etc., it is difficult to constitute a first wall with titanium carbide only.

Thereby, a material excellent in thermal and mechanical properties such as molybdenum material is used as a base and a titanium carbide film of several tens μm in thickness is deposited onto the surface of base, and is used as a titanium carbide deposited first wall. However, since the first wall is eroded during the operation of nuclear fusion apparatus due to the cause as described above, eroded portions have to be repaired with a fresh titanium carbide film on all occasions. In this case, if the first wall of eroded portion is removed from the apparatus and repaired on all occasions, the operation and maintenance of nuclear fusion apparatus is very troublesome and the operation cost becomes high. Therefore, it is very desirable in operation and maintenance of nuclear fusion apparatus using a titanium carbide deposited first wall to develop such a method (i.e. in situ coating method) that the eroded portion can be repaired with a fresh titanium carbide film in vacuo without removing the first wall out of the apparatus. Now then, in a nuclear fusion apparatus which is now under contemplation, when a titanium carbide film is deposited onto the surface of first wall, a distance that a deposition particle (metallic titanium particle) flying out from a titanium vaporizing source has to fly to reach the surface of first wall is about 1 m, and this value increases more and more with a size of nuclear fusion apparatus to grow larger.

In general, the flying distance of deposition particle is decided by a rate of collision and scattering of deposition particle and atmospheric gas particle in space.

The average distance of particle flying from a collision to the next collision (mean free path) can be found by the kinetic theory of gasses. According to the theory, it is necessary to make an atmospheric gas pressure below $5 \times 10^{-5}$ Torr in order that the mean free path is above 1 m. Therefore, if it is intended to fly a deposition particle above 1 m for the purpose of depositing a titanium carbide film onto the surface of first wall of the above mentioned nuclear fusion apparatus, it is necessary to maintain an atmospheric gas pressure below $5 \times 10^{-5}$ Torr during deposition.

Up to now we have a cathodic sputtering method, a reactive ion plating method, a gas phase reaction method and a reactive vacuum deposition method as a method of depositing out a titanium carbide film on a base. However, in the cathodic sputtering method, the reactive ion plating method and the gas phase reaction method, it is necessary to make the pressure of atmospheric gas such as reaction gas, operation gas, etc. above $10^{-3}$ Torr in time of performing deposition, and so these methods cannot be used as an in situ coating method for the first wall of nuclear fusion apparatus for the above mentioned reason.

On the other hand, the reactive vacuum deposition method which has hitherto been known is a method of using ethylene as a reaction gas but, in practice, is very difficult to be put to practical use since the depositing velocity of titanium carbide film onto a base becomes very low when lowering the ethylene gas pressure below $5 \times 10^{-5}$ Torr.

SUMMARY OF THE INVENTION

This invention relates to a process for preparing a titanium carbide film. More particularly, this invention relates to a process for preparing a titanium carbide film by directly reacting a metallic titanium vapor and a acetylene gas at low pressure on a base.

As the result of having made researches on developing a process for preparing a titanium carbide film having such a deposition velocity as capable of being sufficiently put to practical use at a low pressure, the present inventors have found a practically very useful fact that a titanium carbide film can be prepared with such a deposition velocity as capable of being sufficiently put to practical use even at a low pressure (below $5 \times 10^{-5}$ Torr) by depositing a metallic titanium vapor onto a base in an atmosphere of acetylene gas at a low pressure and directly chemical reacting the metallic titanium vapor and acetylene gas on the base, and that, at the step that the chemical composition of deposited film comes up to the most stable composition (stoichiometric composition) of titanium carbide, the reaction terminates spontaneously, since the titanium carbide film is formed directly by a chemical reaction, and so actually it is not necessary to control the chemical composition of titanium carbide film artificially.

The present invention has been made on the basis of this knowledge.

That is, the process of the present invention comprises depositing a titanium carbide film onto a base by generating a metallic titanium vapor under an atmosphere of acetylene gas at a low pressure.

DETAILED DESCRIPTION OF THE PREFERRED EMBODIMENT

As a method of vaporizing metallic titanium in the present invention, any of a heating method by an electron beam, a heating method by sending an electric current directly to metallic titanium, a side heating method, a high-frequency heating method, a method by a laser beam and a method by the irradiation of arc image spot may be used.

If necessary, in order to improve the property of deposited film, an electrical voltage may be applied between a metallic titanium generating source and a base. The temperature range that a titanium carbide film can be deposited in the present invention may be any temperature above room temperature although a temperature above 200° C. is more effective from the viewpoint of intending the improvement of adhesion between the film and the base. As a material capable of being used for a base in the present invention, any material which can bear up under the above mentioned deposition temperature of titanium carbide film may be used.

The thickness of titanium carbide film capable of being deposited onto the base according to the present invention is not specially limited. And the deposition velocity of titanium carbide film depends upon the pressure of acetylene gas and the amount of metallic titanium vapour generated. For example, about 1.5 Å/second of deposition velocity can be easily obtained with $5 \times 10^{-5}$ Torr of acetylene gas pressure.

The process for preparing a titanium carbide film of the present invention will be explained with drawing.

Figure 1:
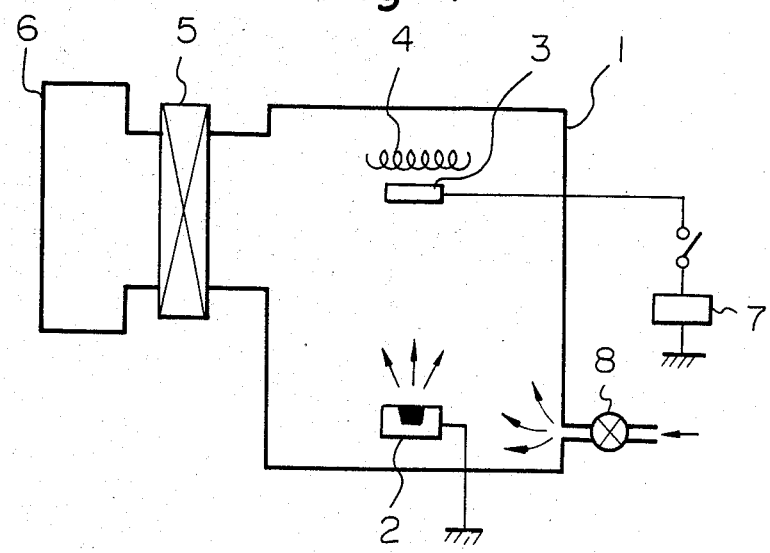
FIG. 1 is a diagram showing an embodiment of the process of the present invention.

In FIG. 1, a vacuum container 1 provided with a metallic titanium vaporizing source 2 and a base 3 with a heater 4 in the interior is evacuated via a vacuum valve 5 by means of a vacuum pump 6. And then the base 3 is heated by the heater 4 to the desired temperature and, if necessary, a definite voltage is applied between the base 3 and the ground by an electric source. After the above operations, an acetylene gas is introduced into the vacuum container 1 through a flow variable vacuum valve 8 and a metallic titanium vapor is generated from the metallic titanium vapor source 2 controlling the pressure to deposit a titanium carbide film onto the base 3.

Figure 2:
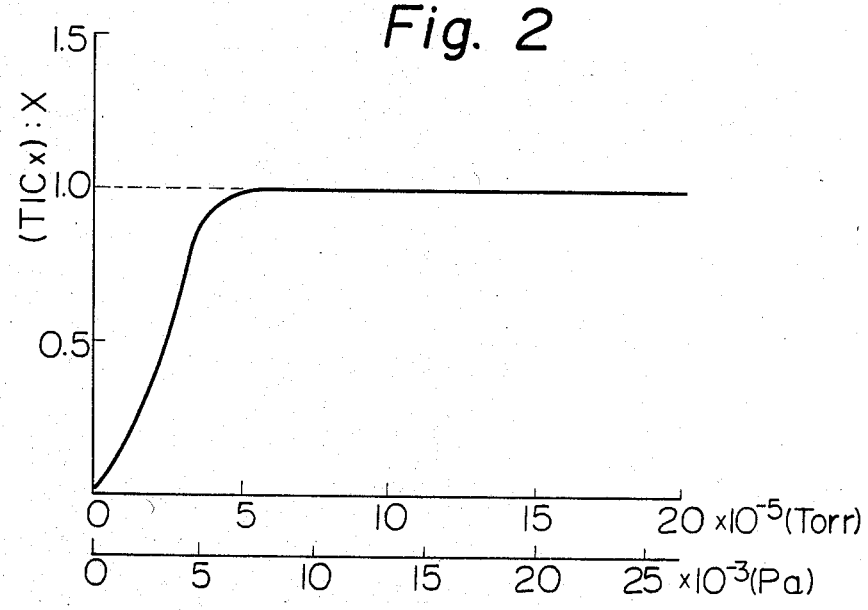
FIG. 2 is a graph showing a characteristic curve of titanium carbide film prepared according to the process of the present invention.

FIG. 2 shows an example of the reaction characteristic curve of titanium carbide film prepared by the process of the present invention. The abscissa represents an acetylene gas pressure and the ordinate represents a chemical composition of deposited film when the acetylene gas pressure is changed under the base temperature of 300° C. and the film deposition velocity of 1.5 Å/second. When the acetylene gas pressure becomes above $5 \times 10^{-5}$ Torr, a stable film of Ti/C=1 (stoichiometric composition of titanium carbide) is formed without depending on the acetylene gas pressure. This means that a reaction of taking more carbon (C) into the film, i.e. a reaction of becoming Ti/C<1, does not proceed even in the presence of excess acetylene gas at a stage that a stoichiometric composition of titanium carbide film is formed because the film of Ti/C=1 which is a stoichiometric composition of titanium carbide is chemically most stable. Therefore, according to the process for preparing a titanium carbide film of the present invention, it is not necessary to control the acetylene gas pressure strictly for preparing a stoichiometric composition of titanium carbide film and so the operation is very easy.

The advantages of the present invention can be given as follows:

(1) A titanium carbide film can be deposited onto a base which is further away because of a preparation process of titanium carbide film under low pressure.

(2) The reaction does not proceed over the stoichiometric composition of titanium carbide so that the preparation condition of film is easily established because of a preparation process utilizing a direct chemical reaction.

(3) The preparation operation is simple because of a preparation process based on a simple principle, and the gas load for a vacuum pump is reduced because of being under low pressure, and so the preparation cost is reduced.

(4) Various kinds of material can be used for a base because a titanium carbide film can be prepared at a low temperature.

What is claimed is:

1. A process for preparing a titanium carbide film by reaction evaporation in the absence of plasma discharge which comprises vaporizing a metallic titanium vaporizing source placed in an atmosphere containing a dilute acetylene gas, and depositing titanium carbide directly onto the surface of a base facing said source.

* * * * *